United States Patent
Korzyniowski et al.

(10) Patent No.: US 6,983,443 B2
(45) Date of Patent: Jan. 3, 2006

(54) SYSTEM AND METHOD FOR PLACING CLOCK DRIVERS IN A STANDARD CELL BLOCK

(75) Inventors: Ryan Matthew Korzyniowski, Fort Collins, CO (US); Troy Horst Frerichs, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/153,749

(22) Filed: May 22, 2002

(65) Prior Publication Data

US 2003/0221179 A1    Nov. 27, 2003

(51) Int. Cl.
   *G06F 17/50*    (2006.01)
(52) U.S. Cl. .............................. 716/18; 716/10; 716/6; 716/8
(58) Field of Classification Search .................. 716/10, 716/6, 8, 18
   See application file for complete search history.

(56) References Cited

U.S. PATENT DOCUMENTS

| | | | | |
|---|---|---|---|---|
| 5,883,814 A | * | 3/1999 | Luk et al. ........................ | 716/2 |
| 5,912,820 A | * | 6/1999 | Kerzman et al. ............... | 716/6 |
| 6,080,206 A | * | 6/2000 | Tadokoro et al. ............. | 716/10 |
| 6,204,713 B1 | * | 3/2001 | Adams et al. ............... | 327/295 |
| 6,305,003 B1 | * | 10/2001 | McBride ...................... | 716/12 |
| 6,311,314 B1 | * | 10/2001 | McBride ........................ | 716/6 |
| 6,484,296 B1 | * | 11/2002 | McBride et al. ................ | 716/5 |
| 6,502,222 B1 | * | 12/2002 | Tetelbaum ..................... | 716/4 |
| 6,513,149 B1 | * | 1/2003 | Donato ........................ | 716/12 |
| 6,536,024 B1 | * | 3/2003 | Hathaway ...................... | 716/6 |
| 6,698,006 B1 | * | 2/2004 | Srinivasan et al. ........... | 716/10 |
| 6,754,877 B1 | * | 6/2004 | Srinivasan ..................... | 716/2 |
| 2003/0177455 A1 | * | 9/2003 | Kaufman et al. .............. | 716/2 |

* cited by examiner

*Primary Examiner*—A. M. Thompson

(57) ABSTRACT

A clock driver placement system and method are provided to place clock drivers in a standard cell block. In accordance with one aspect of the invention, a system is provided for placing clock drivers in a standard cell block. The system operates using logic that establishes an initial clock driver placement pattern, and logic that determines a number of clock drivers needed in the standard cell block to comply with a time specification. The system also includes a logic that adds clock drivers to the standard cell block using the initial clock driver placement pattern. In accordance with another aspect of the invention, a method establishes an initial clock driver placement pattern and determines a number of clock drivers needed in the standard cell block to comply with a time specification. Then, the clock drivers are added to the standard cell block using the initial clock driver placement pattern.

18 Claims, 6 Drawing Sheets

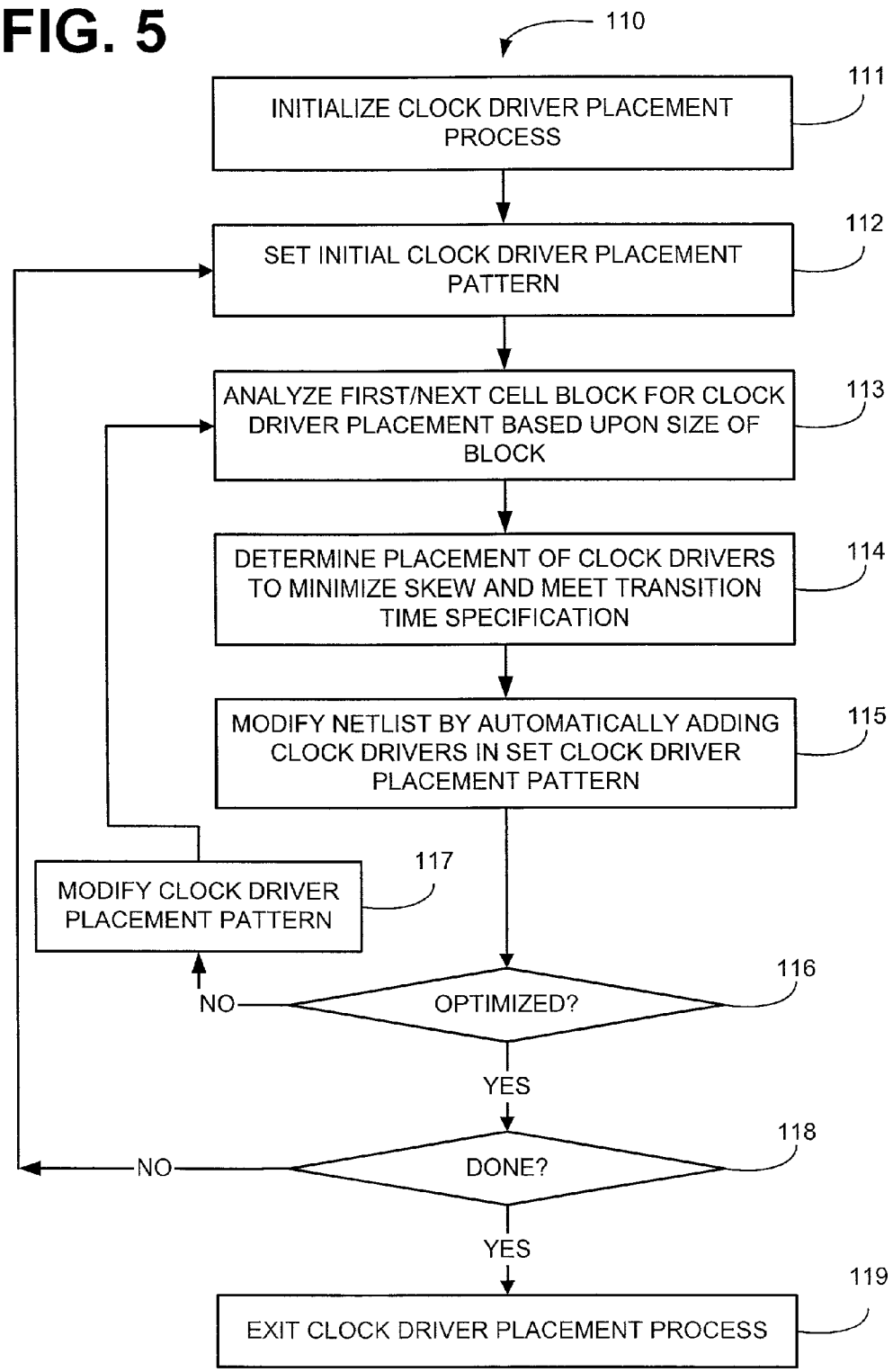

SYSTEM AND METHOD FOR PLACING CLOCK DRIVERS IN A STANDARD CELL BLOCK

BACKGROUND OF THE INVENTION

1. Field of the Invention

The present invention generally relates to computer-aided circuit design systems, and more particularly, to an electrical rules checker system and method for placing clock drivers in a standard cell block.

2. Discussion of the Related Art

Integrated circuits (ICs) are electrical circuits comprising transistors, resistors, capacitors, and other components on a single semiconductor "chip" in which the components are interconnected to perform a variety of functions. Typical examples of ICs include microprocessors, programmable logic devices (PLDs), electrically erasable programmable read only memory devices (EEPROMs), random access memory devices (RAMs), operational amplifiers and voltage regulators. A circuit designer typically designs the IC by creating a circuit schematic indicating the electrical components and their interconnections. Often, designs are simulated by computer to verify functionality and to ensure that performance goals are satisfied.

In electrical device engineering, the design and analysis work involved in producing electronic devices is often performed using electronic computer-aided design (E-CAD) tools. As will be appreciated, electronic devices include analog, digital, mixed hardware, optical, electro-mechanical, and a variety of other electrical devices. The design and subsequent simulation of any circuit, very large scale integration (VLSI) chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device A "netlist" is one common electronic representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules," which are used repetitively throughout the larger circuit. A flat netlist will contain multiple copies of the circuit modules essentially containing no boundary differentiation between the circuit modules and other components in the device. By way of analogy, a graphical representation of a flat netlist is the schematic of the circuit device.

In contrast, a hierarchical netlist will only maintain one copy of a circuit module, which may be used in multiple locations. By way of analogy, a graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function of which are known, but the contents of which are not shown. These "black box" representations, hereinafter called "modules," will mask the complexities therein, typically showing only input/output ports.

An IC design can be represented at different levels of abstraction, such as at the register-transfer level (RTL) and at the logic level, using a hardware description language (HDL). VHDL® and Verilog® are examples of HDL languages. At any abstraction level, an IC design is specified using behavioral or structural descriptions, or a mix of both. At the logical level, the behavioral description is specified using Boolean equations. The structural description is represented as a netlist of primitive cells. Examples of primitive cells are, among others, full-adders, logic gates, latches, and flip-flops.

Set forth above is some very basic information regarding integrated circuits and circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, generally, such systems operate by identifying certain critical timing paths, and then evaluating the circuit to determine whether timing violations may occur through the critical paths. As is known, timing specifications may be provided to such systems by way of a configuration file.

FIG. 1 is a block diagram illustrating a prior art static timing analyzer system that illustrates the basic informational flow in such a system and that is generally denoted by reference numeral 2. Specifically, one such system 2 is marketed under the name PathMill®. FIG. 1 illustrates the informational flow in such a system 2. At the center of the diagram is a static timing analyzer 10, (i.e., the PathMill® program). Surrounding this block 10 are a number of other blocks that represent various input and output files and/or information.

More particularly, the static timing analyzer 10 may utilize a configuration file 12, a file of timing models 14, one or more netlist file(s) 16, a technology file 18, and a parasitics file 20, for various input information. In addition, the static timing analyzer 10 may generate a number of different output files or other output information, including a critical path report 22, a runtime log file 24, an error report 26, a software interface file 28, and a SPICE netlist 30. When started, the static timing analyzer 10 first processes the input netlist file(s) 16, the technology file 18, and the configuration file 12. The information from these files is subsequently used for performing path analyses. Since the function and operation of the static timing analyzer 10 are generally well known, they need not be discussed in detail herein.

While tools such as these are useful for the design verification process after layout, there are various shortcomings in the static timing analyzer 10, and other similar products. These shortcomings include, but are not limited to, the ability to identify appropriate locations for, and to place clock drivers in a standard cell block. Typically, the placing of clock drivers in a standard cell block involves a clock grid that is determined by the block designer and is laid over the cell block. These clock drivers then connect to the cells (i.e. latches and registers). There are multiple clock drivers that drive this clock grid. The number and location of these clock drivers will affect the timing of the clock signal.

Since clock driver count and placement are currently determined manually, the process is slow and time consuming. Numerous manual iterations are done to improve the clock performance, but require significant labor and time.

Consequently, there is a heretofore unaddressed need existing in the industry for a way to address the aforementioned deficiencies and inadequacy.

SUMMARY OF THE INVENTION

The present invention provides a system and method for placing clock drivers in a standard cell block. Briefly described, in architecture, the system for placing clock drivers in a standard cell block can be implemented as follows. The system for placing clock drivers in a standard cell block has logic that establishes an initial clock driver placement pattern, and logic that determines a number of clock drivers needed in the standard cell block to comply with a time specification. The system also includes a logic that adds clock drivers to the standard cell block using the initial clock driver placement pattern.

The invention can also be viewed as providing one or more methods for placing clock drivers in a standard cell block. In this regard, one such method can be summarized by the following steps: (1) establishing an initial clock driver placement pattern; (2) determining a number of clock drivers needed in the standard cell block to comply with a time specification; and (3) adding clock drivers to the standard cell block using the initial clock driver placement pattern.

DESCRIPTION OF THE DRAWINGS

The accompanying drawings incorporated in, and forming a part of the specification, illustrate several aspects of the present invention, and together with the description serve to explain the principles of the invention. In the drawings:

FIG. 5 is a flowchart illustrating one possible implementation of the method for performing the clock driver placement process as shown in FIGS. 2 and 3.

DETAILED DESCRIPTION OF THE PREFERRED EMBODIMENT

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

Figure 1:
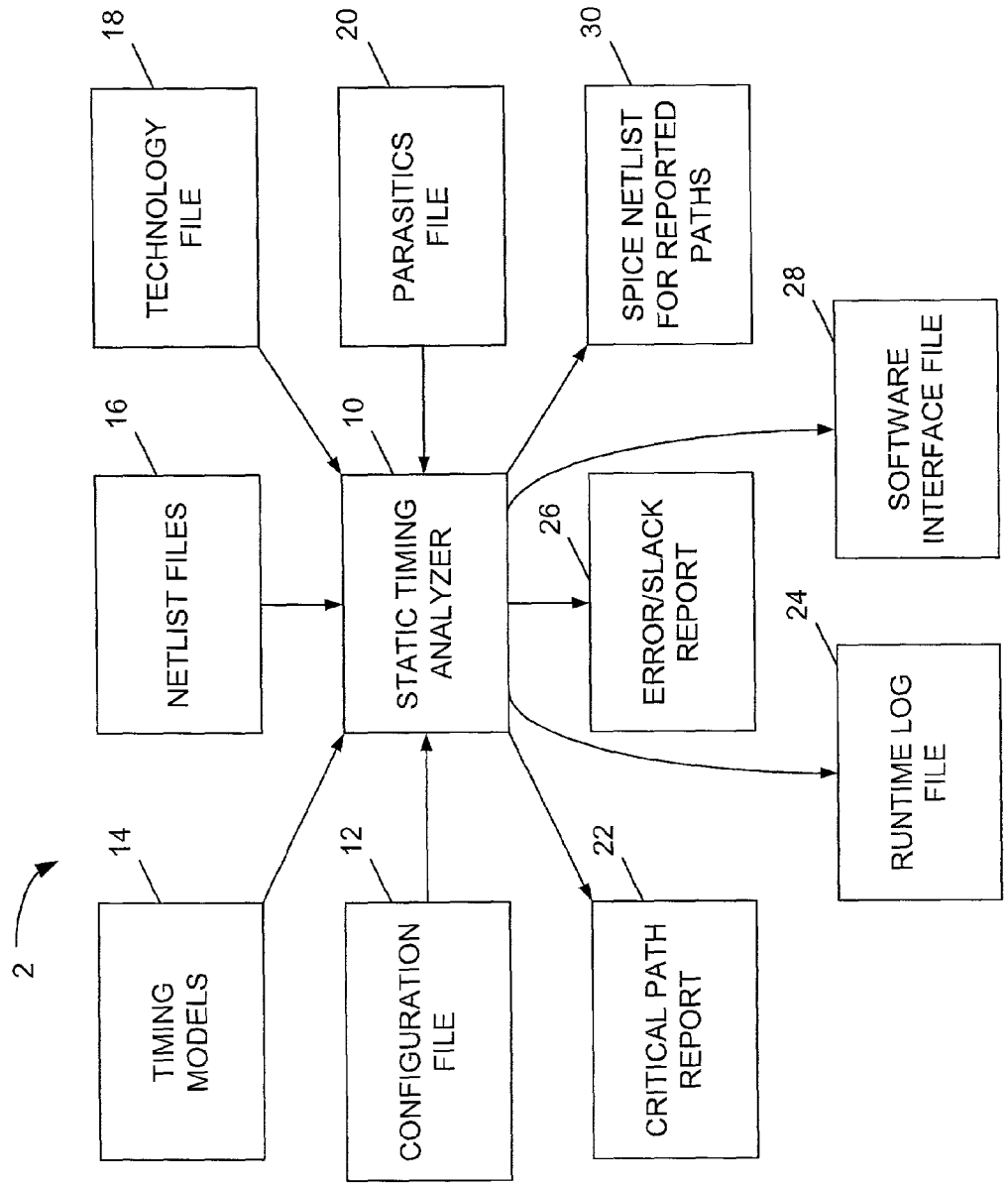
FIG. 1 is a block diagram of a static timing analyzer system, as is known in the prior art.
Figure 2:
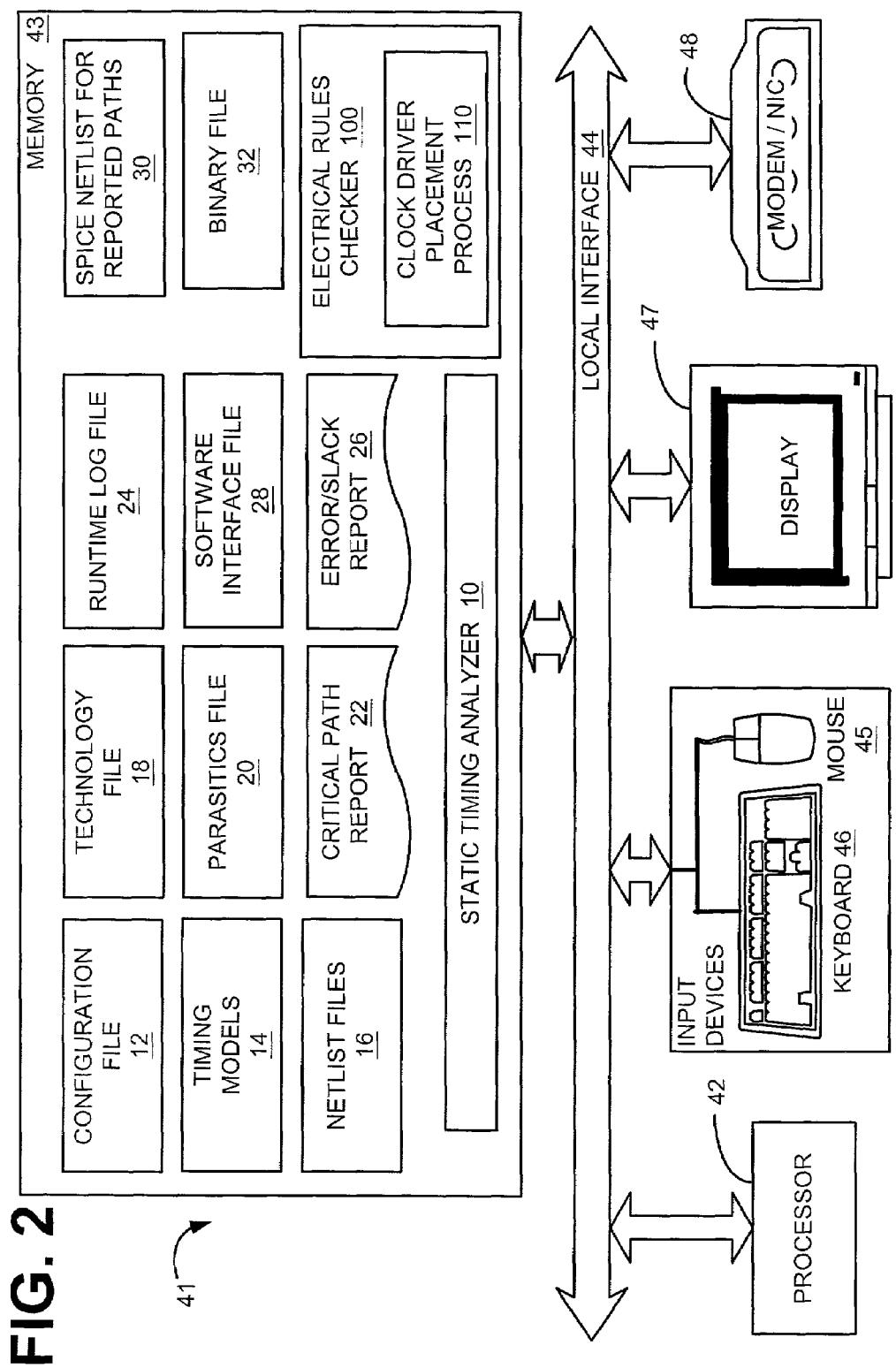
FIG. 2 is a block diagram illustrating one possible implementation of an electrical rules checker that utilizes the clock driver placement process, situated within a computer readable medium.

FIG. 2 is a block diagram illustrating one possible implementation of an electrical rules checker 100 that utilizes the clock driver placement process 110 of the present invention, situated within a computer readable medium. The computer readable medium may be, for example, a memory 43 in a general-purpose computer system 41. A general-purpose computer system can identify, access, and process resources desired by a user.

Generally, in terms of hardware architecture, as shown in FIG. 2, the computer system 41 includes a processor 42, memory 43, and one or more input devices and/or output (I/O) devices (or peripherals) that are communicatively coupled via a local interface 44. The local interface 44 can be, for example, but not limited to, one or more buses or other wired or wireless connections, as is known in the art. The local interface 44 may have additional elements, which are omitted for simplicity, such as controllers, buffers (caches), drivers, repeaters, and receivers, to enable communications. Further, the local interface 44 may include address, control, and/or data connections to enable appropriate communications among the aforementioned components.

The processor 42 is a hardware device for executing software that can be stored in memory 43. The processor 42 can be any custom made or commercially available processor, a central processing unit (CPU) or an auxiliary processor among several processors associated with the computer system 41, and a semiconductor based microprocessor (in the form of a microchip) or a macroprocessor. Examples of suitable commercially available microprocessors are as follows: an 80x86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 43 can include any one or combination of volatile memory elements (e.g., random access memory (RAM, such as DRAM, SRAM, etc.)) and nonvolatile memory elements (e.g., ROM, hard drive, tape, CDROM, etc.). Moreover, the memory 43 may incorporate electronic, magnetic, optical, and/or other types of storage media. Note that the memory 43 can have a distributed architecture, where various components are situated remote from one another, but can be accessed by the processor 42.

The software in memory 43 may include one or more separate programs, each of which comprises an ordered listing of executable instructions for implementing logical functions. In the example of FIG. 2, the software in the memory 43 includes an operating system (not shown), configuration file 12, file of timing models 14, one or more netlist files 16, technology file 18, and a parasitics file 20, containing various input information. The critical path report 22, runtime log file 24, error report 26, software interface file 28, SPICE (i.e., a circuit simulator) netlist 30, and binary file 32 output files or other output information are also situated in memory 43. The electrical rules checker 100 that utilizes the clock driver placement process 110 of the present invention to place clock drivers in a standard cell block is herein defined in further detail with regard to FIGS. 3–5.

A non-exhaustive list of examples of suitable commercially available operating systems is as follows: a Windows operating system from Microsoft Corporation, U.S.A., a Netware operating system available from Novell, Inc., U.S.A., an operating system available from IBM, Inc., U.S.A., any LINUX operating system available from many vendors or a UNIX operating system, which is available for purchase from many vendors, such as Hewlett-Packard Company, U.S.A., Sun Microsystems, Inc. and AT&T Corporation, U.S.A. The operating system essentially controls the execution of other computer programs, such as the electrical rules checker 100 and the clock driver placement process 110, and provides scheduling, input-output control, file and data management, memory management, and communication control and related services.

The electrical rules checker 100 that utilizes the clock driver placement process 110 may be a source program, executable program (object code), script, or any other entity comprising a set of instructions to be performed. When a source program, then the program is usually translated via a compiler, assembler, interpreter, or the like, which may or may not be included within the memory 43, so as to operate properly in connection with the O/S. Furthermore, the electrical rules checker 100 that utilizes clock driver placement process 110 can be written as (a) an object oriented programming language, which has classes of data and methods, or (b) a procedure programming language, which has routines, subroutines, and/or functions, for example but not limited to, C, C++, Pascal, BASIC, FORTRAN, COBOL, Perl, Java, and Ada.

The I/O devices may include input devices, for example but not limited to, a keyboard 46, mouse 45, scanner, microphone, etc. Furthermore, the I/O devices may also include output devices, for example but not limited to, a printer, display 47, etc. Finally, the I/O devices may further include devices that communicate both inputs and outputs, for instance but not limited to, a modulator/demodulator (modem; for accessing another device, system, or network) 48, a radio frequency (RF) or other transceiver, a telephonic interface, a bridge, a router, etc.

If the computer system 41 is a PC, workstation, or the like, the software in the memory 43 may further include a basic input output system (BIOS) (omitted for simplicity). The BIOS is a set of essential software routines that initialize and test hardware at startup, start-up the O/S, and support the transfer of data among the hardware devices. The BIOS is stored in ROM so that the BIOS can be executed when the computer system 41 is activated.

When the computer system 41 is in operation, the processor 42 is configured to execute software stored within the memory 43, to communicate data to and from the memory 43, and to generally control operations of the computer system 41 pursuant to the software. The electrical rules checker 100 that utilizes the clock driver placement process 110 and the O/S are read, in whole or in part, by the processor 42, perhaps buffered within the processor 42, and then executed.

The electrical rules checker 100 that utilizes the clock driver placement process 110 of the present invention can be implemented in hardware, software, firmware or a combination thereof. In the preferred embodiment, the electrical rules checker 100 and the clock driver placement process 110 are implemented in software or firmware that is stored in a memory 43, and that is executed by a suitable instruction execution system, such as processor 42.

Figure 3:
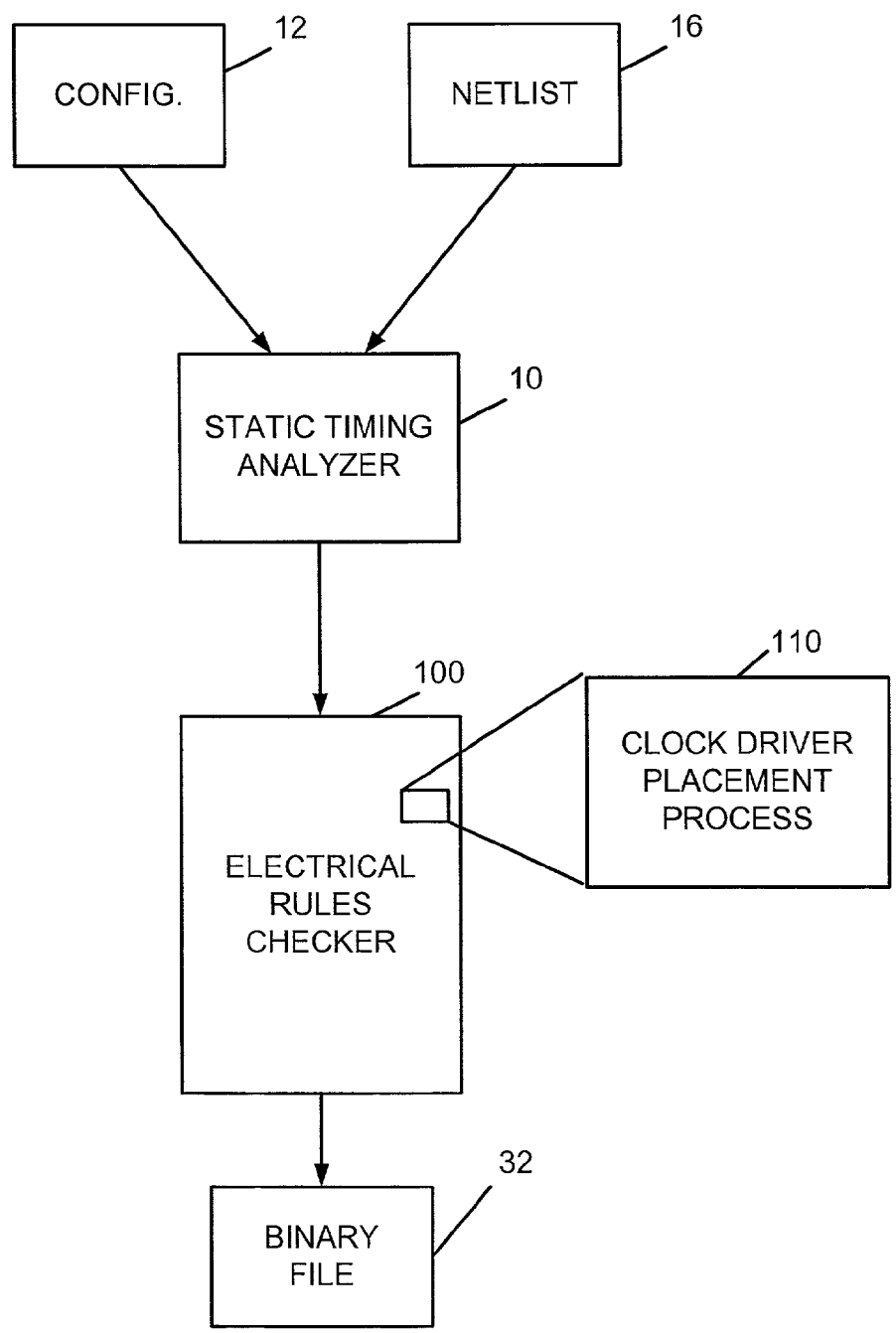
FIG. 3 is a block diagram illustrating one possible implementation of an electrical rules checker and the clock driver placement process of the present invention, as shown in FIG. 2.
Figure 4:
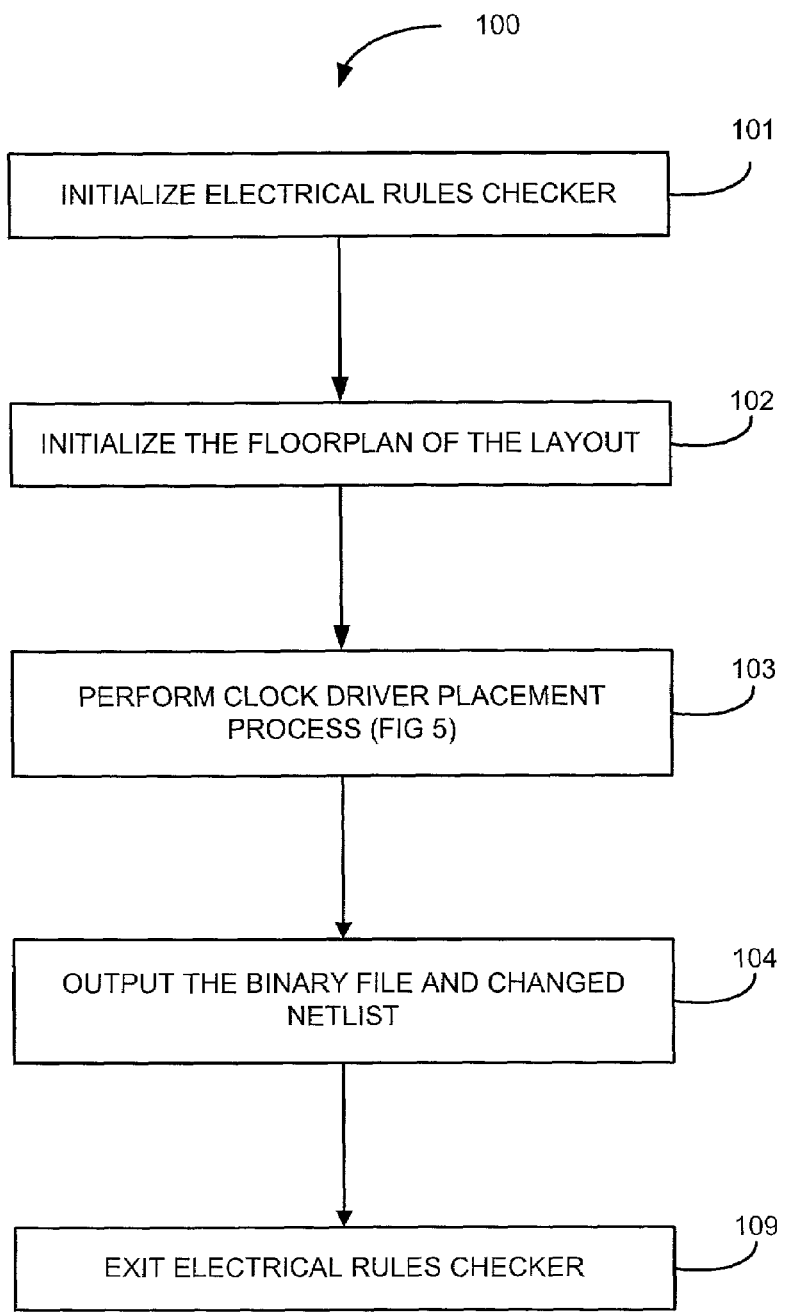
FIG. 4 is a flowchart depicting one possible implementation of the electrical rules checker utilizing the clock driver placement process of the present invention, as shown in FIGS. 2 and 3.

Having set forth the basic and probable circuit configurations of the various structures identified by the method of the present invention, reference is now made to FIGS. 3–5, which collectively comprise a block diagram and flow charts that illustrate the top-level functional operation of the electrical rules checker 100 and clock driver placement process 110 in accordance with the preferred embodiment of the present invention.

FIG. 3 is a block diagram illustrating one possible implementation of an electrical rules checker 100 and the clock driver placement process 110 of the present invention, as shown in FIG. 2. In the illustrated embodiment, only the static timing analyzer 10, the configuration file 12, and the netlist file 16 from FIG. 2 are shown for simplicity. However, it is understood that other input data may be utilized. The configuration file 12 contains information that informs the static timing analyzer 10 how to perform its analysis, and various different configuration files may be used. The netlist file 16, as is well known, defines the various integrated circuit components, and their interrelations and connectivity. The static timing analyzer 10 may make available to the electrical rules checker 100 a binary file output 32.

The electrical rules checker 100 preferably is configured to operate on an output of the static timing analyzer 10. In this regard, the static timing analyzer may be configured to generate output netlist files 16, which the electrical rules checker 100 utilizes as an input. As previously mentioned, there are a wide variety of reasons why an electrical rules checker 100 may be desired. One such reason to utilize an electrical rules checker 100 is to perform various checks over certain rules or strategies in an integrated circuit design. Such rules may vary from circuit to circuit, depending upon the particular application.

The electrical rules checker 100 includes the preferred embodiment of the clock driver placement process 110 of the present invention, and operates to provide a method for placing clock drivers in a standard cell block. Normally, in standard cell blocks, there is a clock grid that is laid over the cell block. The cells (i.e. latches and registers) are typically routed to this clock grid. Normally, the placement of the clock grid is determined by the cell block designer. There are multiple clock drivers that drive this clock grid. The number and location of these clock drivers will affect the timing of the clock signal delivered to the different cells. Since clock driver count and placement were previously determined manually, the process was slow and time consuming, and many iterations were needed to improve the clock performance. These iterations required extensive manual work and time. The clock driver placement process 110 of the present invention performs this process more efficiently and reduces the amount of user intervention.

In an alternative embodiment, the clock driver placement process 110 of the present invention can be performed prior to running the static timing analyzer 10. Running the static timing analyzer 10 after placement of the clock drivers is performed in order to validate that the clock meets the design specifications as well as to test any circuitry that may have been added.

FIG. 4 is a flowchart depicting one possible implementation of the electrical rules checker 100 utilizing the clock driver placement process 110 of the present invention. The electrical rules checker 100 is performed in order to verify that the current design meets the desired clock specification and electrical migration design targets.

First, the electrical rules checker 100 is initialized at step 101. At step 102, the electrical rules checker 100 initializes the floorplan of the current circuit layout. At step 103, the electrical rules checker 100 performs the clock driver placement process, herein defined in further detail with regard to FIG. 5. At step 104, the binary file 32 output file and changed netlist information are output. At step 109, the electrical rules checker 100 exits.

FIG. 5 is a flowchart illustrating one possible implementation of the method for performing the clock driver placement process 110 as shown in FIGS. 2 and 3, that determines a placement of clock drivers and automatically places the clock drivers in the netlist. The clock driver placement process 110 of the present invention calculates the number and placement of clock drivers for a standard cell block. The number of clock drivers is calculated based upon the block size and is then automatically distributed in an initial clock driver placement pattern. This allows the clock driver placement process 110 to quickly setup the driver placement for the initial route and timing runs. A predetermined clock driver placement pattern is chosen in order to minimize the clock skew and meet transition times desired within a standard cell block. Clock skew is the difference in arrival time of a clock signal between any two points.

After determining the location of the calculated number of clock buffers using the predetermined clock driver placement pattern, the clock driver placement process 110 then determines if the clock driver placement is optimum. If the clock driver placement process 110 determines that the placement of the clock drivers is not optimum, the clock driver placement process 110 modifies the clock driver placement pattern and resets the placement of the clock drivers.

First, the clock driver placement process 110 initializes at step 111. At step 112, the clock driver placement process 110 sets the initial clock driver placement pattern. This pattern can be pre-selected by a user or can be a system default pattern. In an alternative embodiment, the clock driver placement pattern may be defined by the user along with one or more alternative patterns to be utilized if the initial clock driver placement pattern is not optimal for the standard cell block being processed.

At step 113, the clock driver placement process 110 analyzes the first/next cell block for the clock driver placement based upon the size of the cell block. After determining the number of clock drivers to be placed on the block, the clock driver placement process 110 determines the placement of the clock drivers at step 114. As stated above, the placement of the clock drivers utilizes the initial clock driver placement pattern. One goal of the placement of the clock drivers is to minimize clock skew and to meet a transition time specification. At step 115, the clock driver placement process 110 modifies the netlist by automatically adding the clock drivers in the set clock driver placement pattern.

At step 116, the clock driver placement process 110 determines if the clock drivers placed in the cell block are optimal. If it is determined at step 116 that the placement of the clock drivers is not optimal, then the clock driver placement process 110 modifies the clock driver placement pattern at step 117, and returns to repeat steps 113–116.

However, if it is determined at step 116 that the clock drivers placed in this cell block are optimized, then the clock driver placement process 110 determines if there are more cell blocks to be processed at step 118. If it is determined at step 118 that there are more cell blocks to be processed, then the clock driver placement process 110 returns to repeat steps 112–118. However, if it is determined at step 118 that there are no further cell blocks to be processed, the clock driver placement process 110 then exits at step 119.

In alternative embodiments, the technique of the placement of clock drivers may be utilized for various other types of elements. These other types of elements include, but are not limited to, test signals and buffers, substrate contacts, antenna corrections and the like.

Having described the method of the present invention, it will be appreciated that the steps illustrated in the flow charts of FIGS. 4 and 5 are provided for purposes of illustration and are not deemed to be limiting on the broader aspects of the present invention. Indeed, the broader aspects of the present invention may be implemented using a variety of different approaches that are still consistent with the scope and content of the present invention.

It should be appreciated that the flow charts of FIGS. 4 and 5 show the top-level operation of only one possible implementation of the methods of the present invention. In this regard, when implemented in software or firmware, as in the case of the preferred embodiment, each block represents a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

Figure 6A:
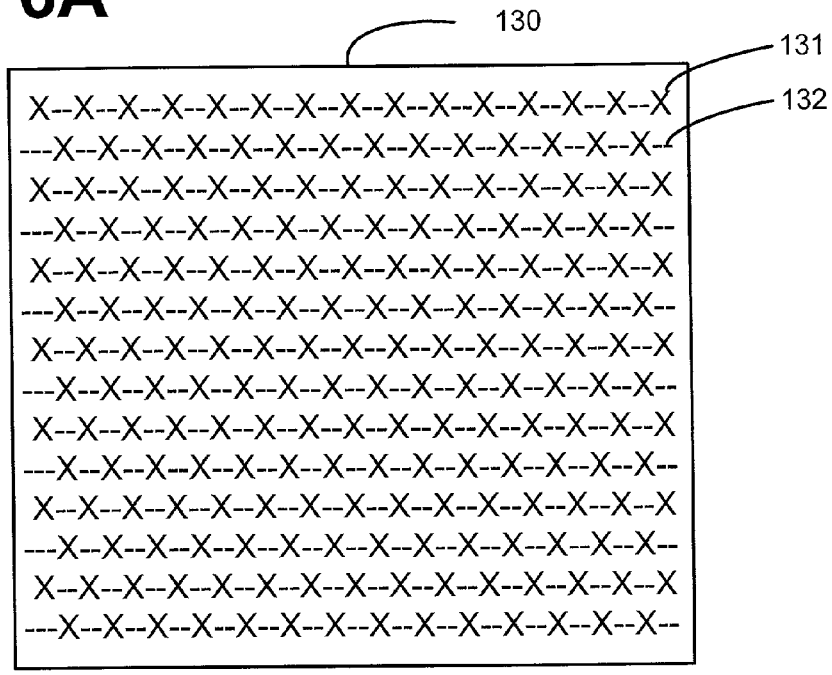
FIGS. 6A and 6B are schematic diagrams illustrating possible examples of optimal clock grid patterns utilized by the clock driver placement process of the present invention, as shown in FIGS. 3–5
Figure 6B:
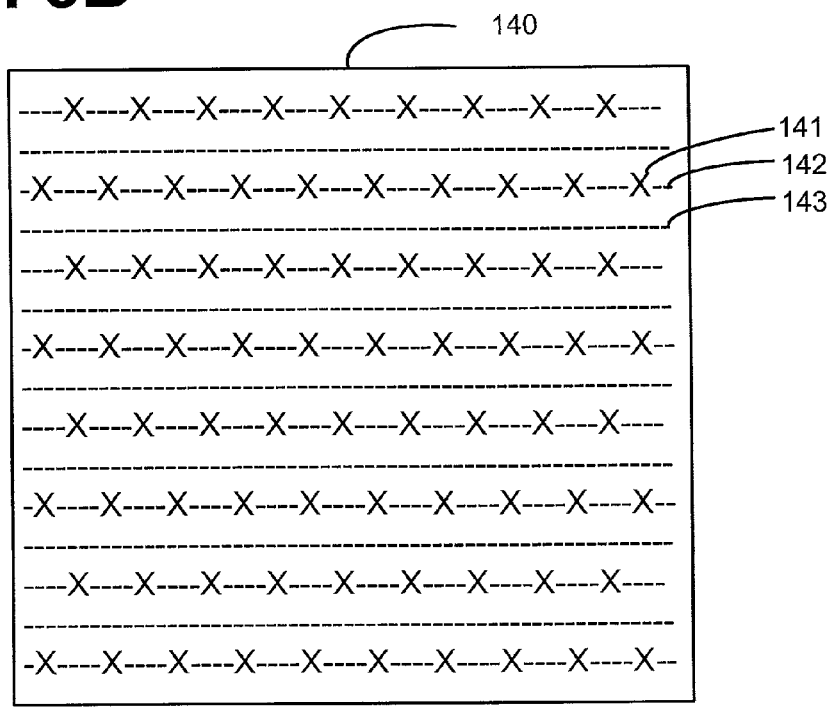

FIGS. 6A and 6B are schematic diagrams illustrating possible examples of optimal clock grid patterns utilized by the clock driver placement process 110 of the present invention, as shown in FIGS. 3–5. As seen in FIG. 6A, one possible clock grid pattern 130 illustrates that the clock buffers are placed in the "X" regions 131 and there are empty or previously used position in the "-" regions 132. As shown, the density is optimized by placing the clock buffers in an alternating pattern. As shown in FIG. 6B, the clock grid pattern 140 illustrates that the clock buffers are placed on alternating lines by skipping a line 143 of empty or utilized positions. Clock buffers are placed in the "X" regions 141 and there are empty positions in the "-" regions 142.

Clock grid patterns 130 and 140 are illustrated for demonstration purposes only. There are numerous clock grid patterns as known in the art that provide for optimum placement of clock buffers within standard cell blocks. It is understood that alternative clock grid patterns can be utilized by the clock driver placement process 110 of the present invention, depending upon the specific cell block application.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for placing clock drivers in a standard cell block, the method comprising:

providing an initial placement pattern for a plurality of clock drivers;

providing a netlist of a standard cell block;

from the initial placement pattern, determining a modifiable placement pattern of a set of the clock drivers to be added to the netlist;

adding to the netlist the modifiable placement pattern of the set of clock drivers;

analyzing whether or not a set of clock signals, provided by the set of clock drivers, meets a timing specification;

modifying the placement of the set of clock drivers when the set of clock signals does not meet the timing specification; and repeating the analyzing and modifying until the set of clock signals meets the timing specification.

2. The method of claim 1, further comprising:

determining the size of the standard cell block.

3. The method of claim 2, wherein determining the modifiable placement pattern further comprises:

calculating the number of clock drivers to be added based on the size of the standard cell block.

4. The method of claim 1, wherein the timing specification is related to at least one of a minimum clock skew and a desired transition time.

5. The method of claim 1, wherein providing an initial placement pattern comprises:

providing one of a first placement pattern pre-selected by a user and a default placement pattern.

6. The method of claim 1, wherein modifying the placement of the set of clock drivers comprises:

replacing the modifiable placement pattern with one of a plurality of alternative placement patterns selected by a user.

7. A system for placing clock drivers in a standard cell block, the system comprising:

means for providing an initial placement pattern for a plurality of clock drivers;

means for providing a netlist of a standard cell block;

means for determining, from the initial placement pattern, a modifiable placement pattern of a set of clock drivers to be added to the netlist;

means for adding to the netlist the set of clock drivers to be added;

means for analyzing whether or not the modifiable placement pattern falls within an acceptable range for a timing specification;

means for modifying the placement of the set of clock drivers when the modifiable placement pattern does not fall within the acceptable range; and means for repeating the analyzing and modifying until the modifiable placement pattern falls within the acceptable range.

8. The system of claim 7, further comprising:

means for determining the size of the standard cell block.

9. The system of claim 8, wherein the determining means further comprises:

means for calculating the set of clock drivers to be added based on the size of the standard cell block.

10. The system of claim 7, wherein the timing specification is at least one of a clock skew parameter and a transition time.

11. The system of claim 7, wherein the means for providing an initial placement pattern comprises:

means for providing one of a first placement pattern pre-selected by a user and a default placement pattern.

12. The system of claim 7, wherein the modifying means comprises:

means for replacing the modifiable placement pattern with one of a plurality of alternative placement patterns selected by a user.

13. A computer-readable storage medium containing program code that is executed by a computer, the program code comprising:

a first code segment configured to store an initial placement pattern for a plurality of clock drivers;

a second code segment configured to store a netlist of a standard cell block;

a third code segment configured to determine, from the initial placement pattern, a modifiable placement pattern of a number of clock drivers to be added to the netlist;

a fourth code segment configured to add to the netlist the number of clock drivers to be added;

a fifth code segment configured to analyze whether or not the modifiable placement pattern meets a timing specification;

a sixth code segment configured to modify the placement of the number of clock drivers when the fifth code segment determines that the modifiable placement pattern does not meet the timing specification; and a seventh code segment configured to repeat the fifth code segment and sixth code segment until the modifiable placement pattern meets the timing specification.

14. The program code of claim 13, further comprising:

an eighth code segment configured to determine the size of the standard cell block.

15. The program code of claim 14, wherein the third code segment is further configured to calculate the number of clock drivers to be added based on the size of the standard cell block.

16. The program code of claim 13, wherein the timing specification is at least one of a minimum clock skew and a desired transition time.

17. The program code of claim 13, wherein the first code segment is configured to provide one of a first placement pattern pre-selected by a user and a default placement pattern.

18. The program code of claim 13, wherein the sixth code segment is further configured to replace the modifiable placement pattern with one of a plurality of alternative placement patterns selected by a user.

* * * * *